(12) United States Patent
Zimmer et al.

(10) Patent No.: US 9,146,287 B2
(45) Date of Patent: Sep. 29, 2015

(54) XMR SENSORS WITH HIGH SHAPE ANISOTROPY

(75) Inventors: Juergen Zimmer, Neubiberg (DE); Klemens Pruegl, Regensburg (DE); Olaf Kuehn, Dresden (DE); Andreas Strasser, Regensburg (DE); Ralf-Rainer Schledz, St. Margarethen (AT); Norbert Thyssen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 635 days.

(21) Appl. No.: 12/946,460

(22) Filed: Nov. 15, 2010

(65) Prior Publication Data

US 2012/0119735 A1 May 17, 2012

(51) Int. Cl.
*G01R 33/02* (2006.01)
*G01R 33/09* (2006.01)
*H01L 43/08* (2006.01)
*H01L 43/12* (2006.01)

(52) U.S. Cl.
CPC ............ *G01R 33/098* (2013.01); *G01R 33/093* (2013.01); *H01L 43/08* (2013.01); *H01L 43/12* (2013.01)

(58) Field of Classification Search
CPC ............................... G01R 33/093; G01R 33/09
USPC .......................................................... 324/252
See application file for complete search history.

(56) References Cited

U.S. PATENT DOCUMENTS

| | | | |
|---|---|---|---|
| 6,297,983 B1 * | 10/2001 | Bhattacharyya | 365/55 |
| 6,485,989 B1 | 11/2002 | Signorini | |
| 6,538,861 B1 | 3/2003 | Hayashi | |
| 7,306,954 B2 | 12/2007 | Nejad | |
| 7,440,241 B2 * | 10/2008 | Hoshino et al. | 360/324.12 |
| 2002/0186583 A1 | 12/2002 | Tuttle | |
| 2003/0145453 A1 | 8/2003 | Kamata | |
| 2005/0072995 A1 | 4/2005 | Anthony | |
| 2005/0101035 A1 | 5/2005 | Nickel | |
| 2005/0148196 A1 | 7/2005 | Sharma | |
| 2005/0170628 A1 | 8/2005 | Sharma | |
| 2006/0014305 A1 | 1/2006 | Lee | |

(Continued)

FOREIGN PATENT DOCUMENTS

| | | |
|---|---|---|
| CN | 1755387 | 4/2006 |
| CN | 1755387 A | 4/2006 |
| DE | 44 34 912 A1 | 4/1996 |

OTHER PUBLICATIONS

Diegel et al., "360° Domain Wall Investigation for Sensor Applications", pp. 2655-2657, *IEEE Transactions on Magnetics*, vol. 40, No. 4, Jul. 2004.

Novolechnik Siedle Group, "Motivation for Multiturn", 40 pages (including translation), dated Aug. 2, 2005.

German Office Action, Application No. 102011085955.1, mailed Apr. 28, 2012, 7 pages.

(Continued)

*Primary Examiner* — Reena Aurora
(74) *Attorney, Agent, or Firm* — Schiff Hardin LLP

(57) ABSTRACT

Embodiments relate to xMR sensors having very high shape anisotropy. Embodiments also relate to novel structuring processes of xMR stacks to achieve very high shape anisotropies without chemically affecting the performance relevant magnetic field sensitive layer system while also providing comparatively uniform structure widths over a wafer, down to about 100 nm in embodiments. Embodiments can also provide xMR stacks having side walls of the performance relevant free layer system that are smooth and/or of a defined lateral geometry which is important for achieving a homogeneous magnetic behavior over the wafer.

10 Claims, 5 Drawing Sheets

(56) References Cited

U.S. PATENT DOCUMENTS

| | | |
|---|---|---|
| 2006/0103991 A1 | 5/2006 | Hoshino et al. |
| 2006/0220084 A1 | 10/2006 | Umehara |
| 2006/0261425 A1 | 11/2006 | Suemitsu |
| 2007/0001251 A1 | 1/2007 | Saito |
| 2009/0015252 A1* | 1/2009 | Raberg et al. ............ 324/252 |

OTHER PUBLICATIONS

Chinese Second Office Action and Search Report from related Chinese Application 201110360959.2, dated Aug. 13, 2014, English Translation, 15 pgs.

Office Action dated Aug. 13, 2014 for Chinese Application No. 201110360959.2.

* cited by examiner

US 9,146,287 B2

XMR SENSORS WITH HIGH SHAPE ANISOTROPY

TECHNICAL FIELD

The invention relates generally to integrated circuit (IC) sensors and more particularly to magnetoresistive IC current sensors having very high shape anisotropy.

BACKGROUND

Magnetoresistive sensors can include giant magnetoresistive (GMR), tunnel magnetoresistive (TMR), anisotropic magnetoresistive (AMR) and other technologies, referred to collectively as xMR technologies. For some applications of these xMR sensors, very high shape anisotropy of the xMR strip, i.e., a length of the xMR strip being much greater than the width or vice-versa, is needed. For example, a multi-turn sensor for sensing a number of turns of a rotating magnetic field needs a very narrow xMR strip width, such as on the order of 200 nanometers (nm) or less. The width also must be very accurate and uniform across a wafer and from wafer to wafer to achieve a high manufacturing yield. Further, no significant chemical modification of the etched side walls after processing can occur, as such corrosion can cause a performance drift.

In other words, the manufacturing challenges for xMR sensors needing very high shape anisotropy are many. Conventional etch processes suitable for mass production of xMR stacks make meeting these challenges very difficult. For example, ion beam milling processes are often used in conventional manufacturing processes. Chemical etches or resist removal processes used therein, however, can damage sidewalls, thereby degrading magnetic performance, and can provide non-uniform behaviors over the wafer, both significant drawbacks. Ion beam milling processes are also slow and typically not suitable for mass production. Therefore, a need remains for an improved xMR sensor.

SUMMARY

In an embodiment, a magnetoresistive sensor element comprises a first magnetoresistive stack portion comprising a free layer and having first, second, third and fourth sides; and a second magnetoresistive stack portion coupled to the first magnetoresistive stack portion and having fifth, sixth, seventh and eighth sides each being non-flush with the first, second, third and fourth sides.

In another embodiment, a method of manufacturing a magnetoresistive sensor element comprises providing a substrate; applying a dielectric layer to the substrate and structuring the dielectric layer; applying a free-layer system and structuring the free-layer system; applying additional stack layers on the free-layer system; and structuring the additional stack layers such that lateral dimensions of the additional stack layers are greater than lateral dimensions of the free-layer system and sides of the additional stack layers are non-flush with sides of the free-layer system.

In another embodiment, a method of manufacturing a magnetoresistive sensor element comprises providing a substrate; applying a first dielectric layer to the substrate; forming a groove in the first dielectric layer; applying an xMR stack on the first dielectric layer, a height of the groove being greater than a height of the xMR stack; applying a second dielectric layer on the xMR stack; and removing portions of the xMR stack and the second dielectric layer from the first dielectric layer.

In another embodiment, a method of manufacturing a magnetoresistive sensor element comprises providing a substrate; providing a resist layer on the substrate; structuring the resist layer to form a groove having negatively sloped sidewalls; applying a free-layer system on the resist layer and in the groove, the free-layer system in the groove spaced apart from the sidewalls; removing portions of the resist layer on the substrate and portions of the free-layer system on the resist layer; and applying and structuring a remaining stack over the free-layer system on the substrate.

BRIEF DESCRIPTION OF THE DRAWINGS

The invention may be more completely understood in consideration of the following detailed description of various embodiments of the invention in connection with the accompanying drawings, in which.

Figure 1:
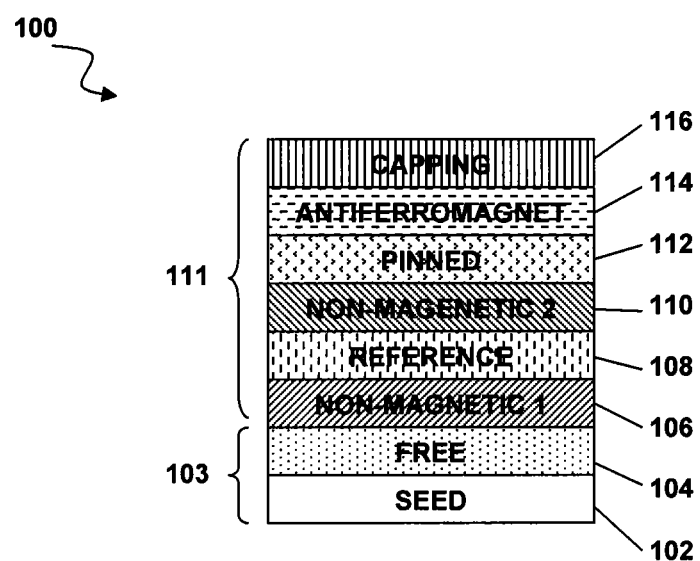
FIG. 1 depicts an xMR stack according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to xMR sensors having very high shape anisotropy. Embodiments also relate to novel structuring processes of xMR stacks to achieve very high shape anisotropies without chemically affecting the performance relevant magnetic field sensitive layer system while also providing comparatively uniform structure widths over a wafer, down to about 100 nm in embodiments. Embodiments can also provide xMR stacks having side walls of the performance relevant free layer system that are smooth and/or of a defined lateral geometry which is important for achieving a homogeneous magnetic behavior over the wafer.

In an embodiment, a minor loop determining part of an xMR stack is structured without a direct chemical etch process and achieves very narrow widths. The structuring of the xMR stack can be split into two processes: a first process in which the performance relevant free-layer system is structured without directly etching, such as by a damascene or lift-off process, and a second process in which the remaining stack is coupled to a sensor layer and structured with relaxed lateral dimensions, i.e., larger than the free layer system, by a conventional etch process. In an embodiment, the entire xMR stack is structured by a damascene process, which can provide very narrow xMR structures without a direct chemical etch.

FIG. 1 depicts an xMR stack 100 based on a top spin-valve (TSV) principle according to an embodiment. In an embodiment, stack 100 comprises a seed layer 102, for example Ta, TaN, NiCr or some other suitable material; a free layer 104, which is the sensor layer and can be, for example, NiFe, CoFe, CoFeB or some other suitable material as a single layer or a multilayer combination; a first non-magnetic layer 106, such as Cu, Al2O3/MgO in a TMR device, or some other suitable material; a reference layer 108, or ferromagnetic layer, such as CoFe or some other suitable material; a second non-magnetic layer 110, such as Ru or some other suitable material; a pinned layer 112, or further ferromagnetic layer, such as CoFe or some other suitable material; a natural anti-ferromagnet 114, such as IrMn, PtMn or some other suitable material; and a capping layer 116, such as Ta, TaN or some other suitable material. Seed layer 102 and free layer 104 will be referred to herein as free-layer system 103, with remainder of stack 100 referred to as remaining stack 111. The various dimensions and thicknesses as depicted in FIG. 1 are not to scale.

Figure 2:
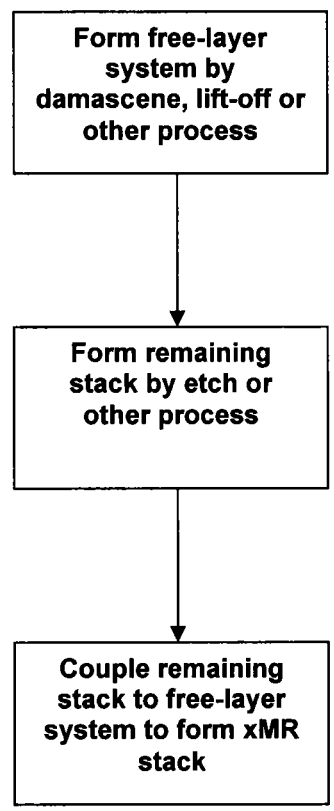
FIG. 2 depicts a flowchart according to an embodiment.
Figure 3:
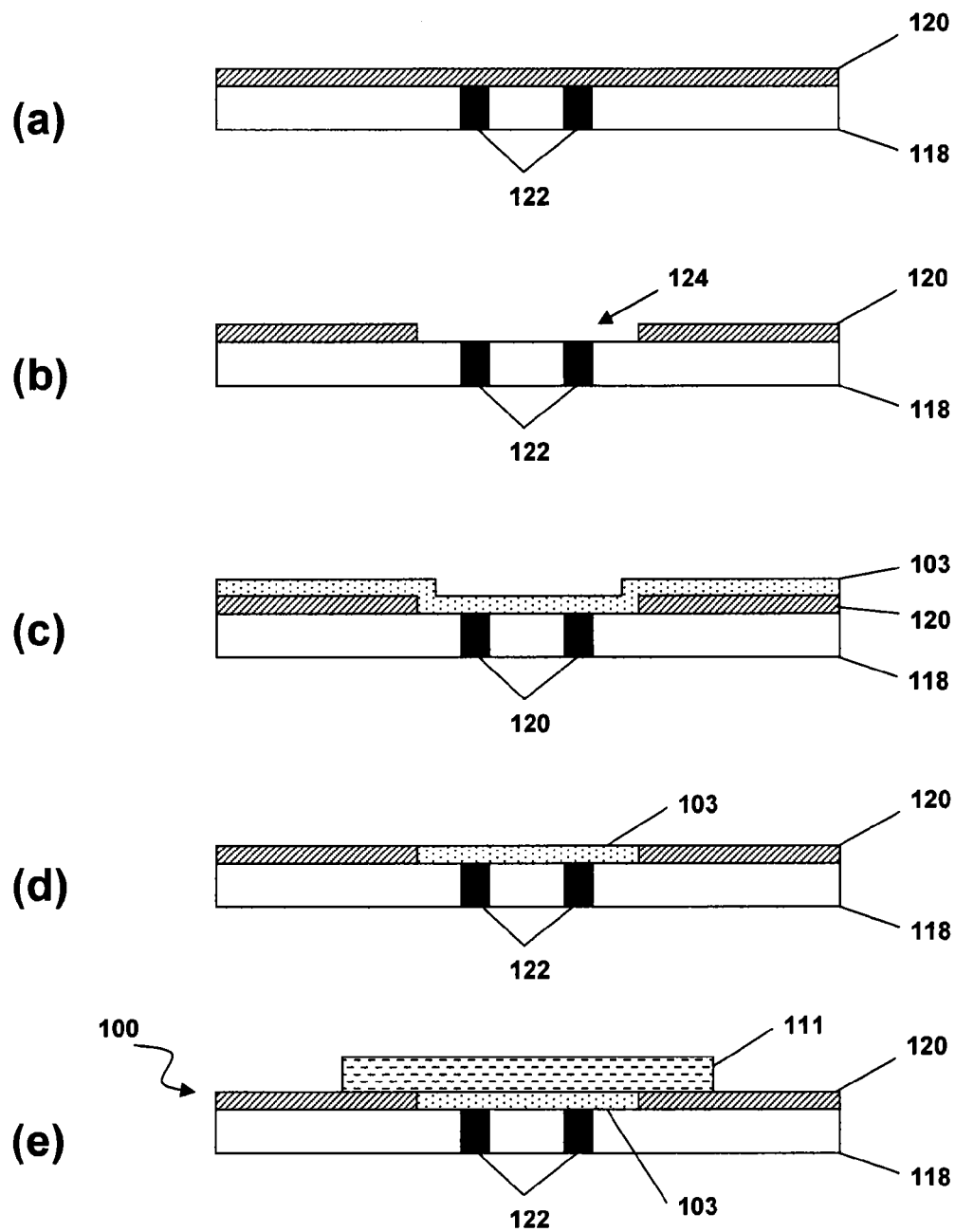
FIG. 3 depicts a process according to an embodiment.

As previously mentioned, free-layer system 103 is the portion of stack 100 that is most performance-relevant. Therefore, in an embodiment, the structuring of stack 100 can be split into two processes as illustrated in FIG. 2: a first process in which performance relevant free-layer system 103 is structured without directly etching, such as by a damascene or lift-off process, and a second process in which remaining stack 111 is coupled to a sensor layer and structured with relaxed lateral dimensions by a conventional etch process. Referring to FIG. 3, a damascene structuring process of free-layer system 103 according to an embodiment is depicted. Embodiments can include more or fewer steps than specifically illustrated, as understood by one skilled in the art; for example, a lithography process can occur between (a) and (b) but is not depicted.

At (a), a thin dielectric 120 is applied to a substrate 118. In an embodiment, substrate 118 has a polished surface on which dielectric 120 is applied and includes two vias 122 for later providing a connection to an underlying wiring metal. In embodiments, dielectric 120 comprises silicon nitride or oxide and is applied with a thickness approximately equal to that desired for free layer system 103. Other suitable dielectric materials can be used in other embodiments. As depicted, vias 122 are plugged with tungsten during processing.

At (b), a groove 124 having the desired geometry of free layer system 103 is etched into dielectric 120 with a high selectivity to the underlying oxide of substrate 118. In embodiments, a width of groove 124 is in a range of about 100 nm to about 300 nm, such as about 200 nm in one embodiment.

At (c), free-layer system 103 is deposited. Free-layer system 103 as deposited can include seed layer 102, free layer 104 and optional additional functional layers in embodiments.

At (d), a chemical-mechanical polishing (CMP) process removes the portions of free-layer system 103 on dielectric 120. Free-layer system 103 remains in former groove 124.

At (e), remaining stack 111 is deposited. In an embodiment, remaining stack 111 has been structured by a standard etch process, such as a chemical, plasma or sputter etch process, the dimensions of remaining stack 111 being relaxed relative to those of free-layer system 103, and is deposited after a conditioning process is carried out on polished free layer 103.

In an embodiment, stack 100 thus comprises a first portion (free-layer system 103) and a second portion (remaining stack 111). In one embodiment, lateral dimensions of remaining stack 111 are generally greater than those of free-layer system 103. For example, and referring to stack 100 as oriented on the page in FIG. 3 at (e), a width (left-right lateral dimension) of remaining stack 111 is greater than a width of free-layer system 103 in former groove 124, and a depth (lateral dimension into the page) of remaining stack 111 is also greater than a depth of free-layer system 103. In another embodiment, lateral dimensions of remaining stack 111 are generally less than those of free-layer system 103. In other words, sidewall portions of free-layer system 103 do not align or are not flush with sidewall portions of remaining stack 111.

Figure 4:
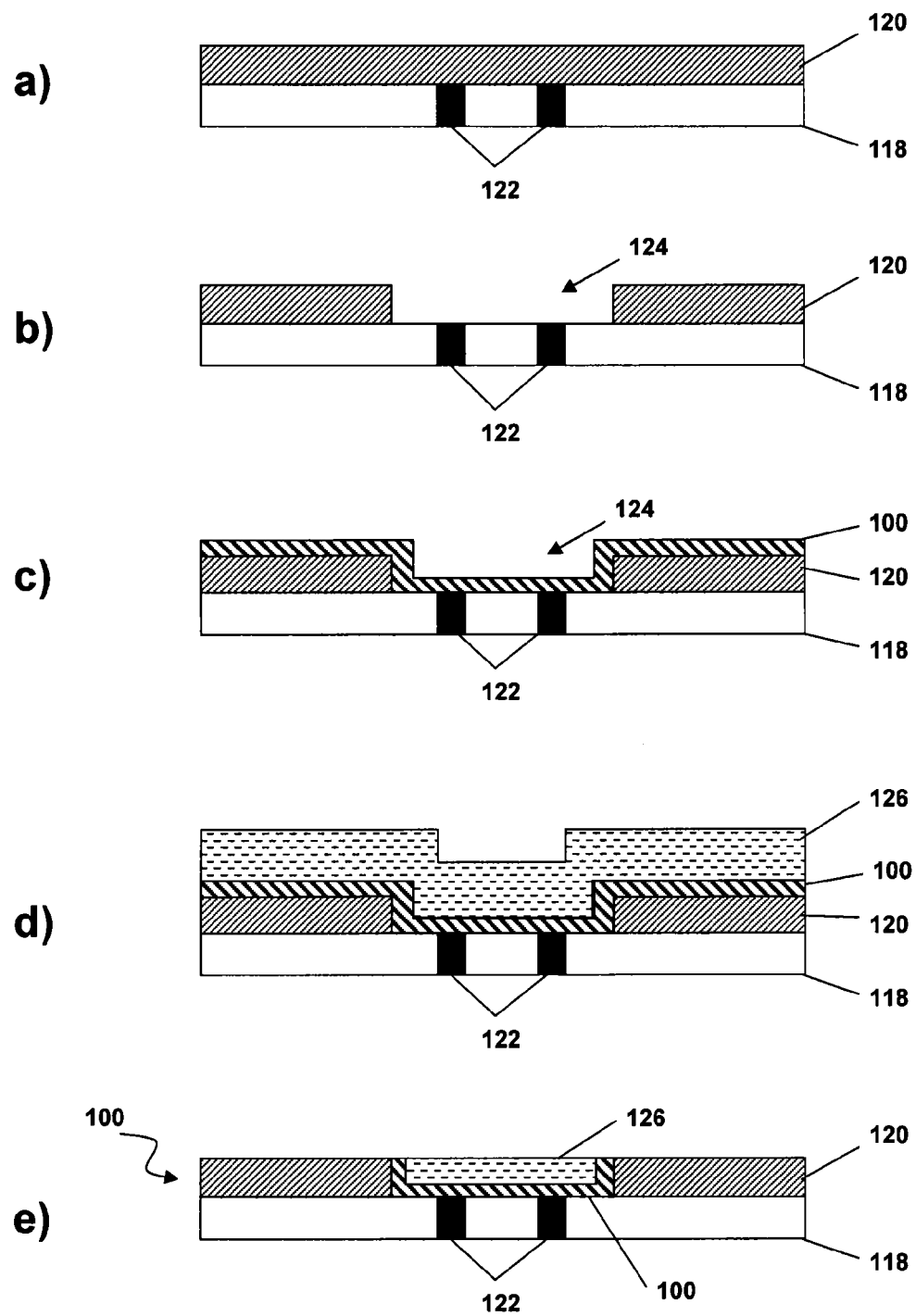
FIG. 4 depicts a process according to an embodiment.

In another embodiment, the entirety of stack 100 can be structured according to a damascene process. Referring to FIG. 4, at (a) a dielectric layer 120 is applied to a substrate 118. As in the embodiment of FIG. 3, substrate 118 can comprise vias 122. In an embodiment, a thickness of dielectric 120 is greater than a thickness of the entire xMR stack.

At (b), groove 124 is formed with the geometry of the sensor structure, free layer system 103. As in the embodiment of FIG. 3, more or fewer processes can occur than those specifically depicted in FIG. 4. For example, a lithography process can occur between (a) and (b).

At (c), the entire xMR stack 100 is deposited, and at (d) another dielectric film 126, such as an oxide, is deposited.

At (e), a CMP process removes dielectric film 126 and xMR stack 100 outside groove 124. As a result, only the portion of stack 100 in groove 126 remains on the wafer.

Figure 5:
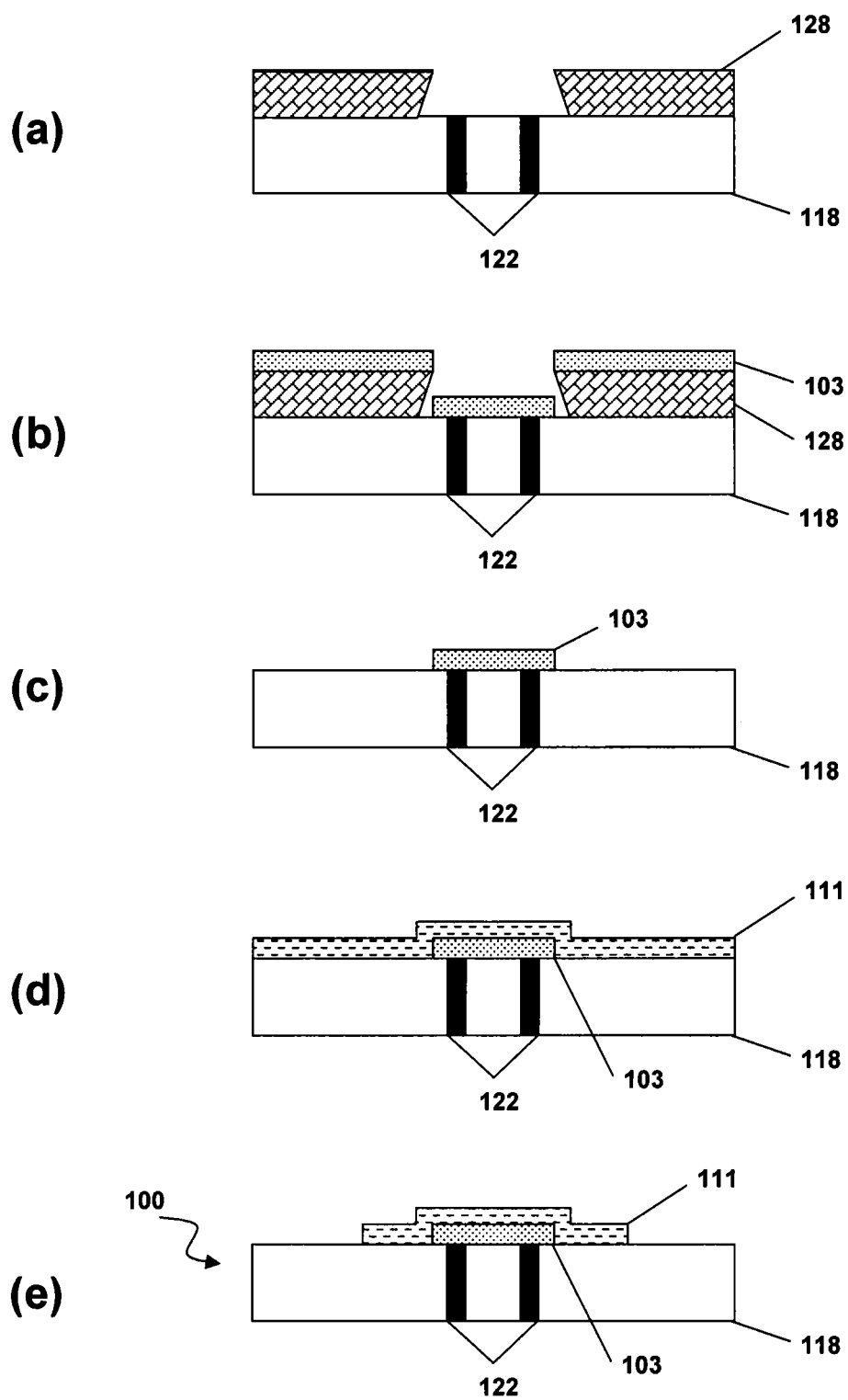
FIG. 5 depicts a process according to an embodiment.

Another embodiment is depicted in FIG. 5, in which the free-layer system portion of an xMR stack is structured without a direct chemical etch by using a lift-off technique, in contrast with the damascene process discussed in other embodiments. At (a), a structured resist 128 is provided on substrate 118, which has negatively sloped sidewalls in an embodiment. In other embodiments, non-negatively sloped sidewalls are used with a strong lift-off force, such as a scrubber in an embodiment. At (b), free-layer system 103 is deposited. Resist 128 and free-layer system 103 on substrate 118 are then removed. In embodiments, this removal can be carried out by a pressure jet of resist solvent, an ultrasonic treatment within a resist solvent or some other suitable process. The structure remaining is shown at (c). At (d), remaining stack 111, structured according to a conventional etch process, is deposited after, in an embodiment, a cleaning of the surface of free-layer system 103.

Various advantages are presented by embodiments. For example, very small free-layer system dimensions, such as down to about 100 nm, are possible without a complex xMR stack etch process. Further, those dimensions can be highly uniform over an entire wafer, and the free-layer system can have desired smooth side walls uniform over the wafer, thereby presenting highly uniform magnetic properties. In embodiments utilizing damascene processes, the structure of the free-layer system can be based on a well-established chemical etch of a dielectric layer. Even embodiments of larger sensor structures, such as those in the micrometer dimension range, can benefit from the reproducible geometrics of the free-layer system side walls. This can include both ideally smooth as well as defined "rough" walls in various embodiments. Embodiments can have applicability in rotation, multi-turn and revolution-counting applications as well as other suitable sensing applications.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetoresistive sensor element comprising:
   a first magnetoresistive stack portion formed by a damascene process and comprising a free layer and having a first width and a first length; and
   a second magnetoresistive stack portion formed by an etch process and coupled to the first magnetoresistive stack portion such that a magnetoresistive stack formed by the first and second magnetoresistive stack portions has a height, the second magnetoresistive stack portion having a second width and a second length, at least one of the second width or the second length being different from the first width or the first length, respectively,
   wherein the second magnetoresistive stack portion overlaps and extends beyond the first magnetoresistive stack portion.

2. The magnetoresistive sensor element of claim 1, wherein the first magnetoresistive stack portion comprises a first surface having a first area defined by the first width and the first length, and wherein the second magnetoresistive stack portion comprises a second surface having a second area different from the first area, the second area defined by the second length and the second width.

3. The magnetoresistive sensor element of claim 2, wherein the second area is greater than the first area.

4. The magnetoresistive sensor element of claim 2, wherein the second area is less than the first area.

5. The magnetoresistive sensor element of claim 1, wherein the magnetoresistive sensor element is one of a giant magnetoresistive (GMR) or a tunnel magnetoresistive (TMR) sensor element.

6. The magnetoresistive sensor element of claim 1, wherein the etch process comprises one of a chemical etch or a sputter etch.

7. The magnetoresistive sensor element of claim 1, wherein at least one of the first width or the first length is about 200 nanometers or less.

8. The magnetoresistive sensor element of claim 1, wherein the first magnetoresistive stack portion is applied and formed before the second magnetoresistive stack portion is applied on the first magnetoresistive stack portion and formed.

9. A magnetoresistive sensor element comprising:
   a first magnetoresistive stack portion formed by a lift-off process and comprising a free layer and having a first width and a first length; and
   a second magnetoresistive stack portion formed by an etch process and coupled to the first magnetoresistive stack portion such that a magnetoresistive stack formed by the first and second magnetoresistive stack portions has a height, the second magnetoresistive stack portion having a second width and a second length, at least one of the second width or the second length being different from the first width or the first length, respectively,
   wherein the second magnetoresistive stack portion overlaps and extends beyond the first magnetoresistive stack portion.

10. The magnetoresistive sensor element of claim 9, wherein the etch process comprises one of a chemical etch or a sputter etch.

* * * * *